(12) United States Patent
Lin et al.

(10) Patent No.: US 10,672,893 B2
(45) Date of Patent: Jun. 2, 2020

(54) METHOD OF MAKING SEMICONDUCTOR DEVICE COMPRISING FLASH MEMORY AND RESULTING DEVICE

(71) Applicant: Taiwan Semiconductor Manufacturing Co., Ltd., Hsin-Chu (TW)

(72) Inventors: Chien-Hung Lin, Hsin-Chu (TW); Chun-Chieh Mo, Kaohsiung (TW); Shih-Chi Kuo, Yangmei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/032,601

(22) Filed: Jul. 11, 2018

(65) Prior Publication Data
US 2019/0165148 A1   May 30, 2019

Related U.S. Application Data

(60) Provisional application No. 62/592,660, filed on Nov. 30, 2017.

(51) Int. Cl.
| | |
|---|---|
| *H01L 21/00* | (2006.01) |
| *H01L 29/66* | (2006.01) |
| *H01L 29/792* | (2006.01) |
| *H01L 29/06* | (2006.01) |
| *H01L 21/3213* | (2006.01) |
| *H01L 21/311* | (2006.01) |

(Continued)

(52) U.S. Cl.
CPC .. *H01L 29/66833* (2013.01); *H01L 21/31144* (2013.01); *H01L 21/32137* (2013.01); *H01L 27/1157* (2013.01); *H01L 27/11573* (2013.01); *H01L 29/0649* (2013.01); *H01L 29/42344* (2013.01); *H01L 29/792* (2013.01)

(58) Field of Classification Search
CPC ......... H01L 21/31144; H01L 21/32137; H01L 29/66833; H01L 27/1157
See application file for complete search history.

(56) References Cited

U.S. PATENT DOCUMENTS

| | | | |
|---|---|---|---|
| 5,918,128 A * | 6/1999 | Gardner | H01L 21/28123 257/E21.206 |
| 5,924,001 A * | 7/1999 | Yang | H01L 21/28061 257/340 |

(Continued)

*Primary Examiner* — Nicholas J Tobergte
(74) *Attorney, Agent, or Firm* — Duane Morris LLP

(57) ABSTRACT

A semiconductor device and method for making the semiconductor device comprising a flash memory cell is provided. In accordance with some embodiments, the method includes: patterning a first gate material layer and a gate insulating film over a substrate, the first gate material layer comprising a first gate material, the gate insulating film disposed on the first gate material layer; forming a second gate material layer over the substrate, the gate insulating film, and side walls of the first gate material layer, the second gate material layer comprising a second gate material; etching the second gate material layer to expose the substrate and the gate insulating film and provide a portion of the second gate material layer along each of the side walls of the first gate material layer; and etching the gate insulating film and the first gate material layer so as to form a plurality of gate structures.

20 Claims, 12 Drawing Sheets

(51) Int. Cl.
*H01L 27/1157* (2017.01)
*H01L 27/11573* (2017.01)
*H01L 29/423* (2006.01)

(56) References Cited

U.S. PATENT DOCUMENTS

| | | | |
|---|---|---|---|
| 6,074,915 A | 6/2000 | Chen et al. | |
| 6,096,602 A * | 8/2000 | Kim | H01L 27/11534 |
| | | | 438/257 |
| 6,509,267 B1 * | 1/2003 | Woo | H01L 21/76801 |
| | | | 257/E21.576 |
| 6,569,729 B1 | 5/2003 | Wu et al. | |
| 6,849,526 B2 * | 2/2005 | Lai | H01L 27/11568 |
| | | | 257/390 |
| 7,851,354 B2 * | 12/2010 | Seo | H01L 21/76837 |
| | | | 257/E21.507 |
| 8,884,352 B2 * | 11/2014 | Shum | H01L 27/11521 |
| | | | 257/314 |
| 8,912,590 B2 | 12/2014 | Hirano | |
| 8,956,941 B2 * | 2/2015 | Tsukuda | H01L 29/66833 |
| | | | 438/287 |
| 9,099,309 B2 * | 8/2015 | Guo | H01L 21/02532 |
| 9,099,466 B2 * | 8/2015 | Miyazaki | H01L 27/11573 |
| 9,184,264 B2 * | 11/2015 | Tsukuda | H01L 29/66833 |
| 9,190,333 B2 * | 11/2015 | Hirano | H01L 27/11573 |
| 9,337,142 B2 * | 5/2016 | Miyazaki | H01L 27/11573 |
| 9,607,954 B2 * | 3/2017 | Yajima | H01L 24/02 |
| 9,653,164 B2 * | 5/2017 | Hong | G11C 14/0063 |
| 2009/0273013 A1 * | 11/2009 | Winstead | H01L 27/11526 |
| | | | 257/315 |
| 2012/0306001 A1 * | 12/2012 | Hirano | H01L 27/11573 |
| | | | 257/324 |
| 2014/0125421 A1 * | 5/2014 | Miyazaki | H01L 27/11573 |
| | | | 331/111 |
| 2014/0152379 A1 * | 6/2014 | Fujimoto | H02M 3/073 |
| | | | 327/536 |
| 2014/0213030 A1 * | 7/2014 | Tsukuda | H01L 29/66833 |
| | | | 438/287 |
| 2014/0353740 A1 * | 12/2014 | Nishida | H01L 21/82381 |
| | | | 257/326 |
| 2015/0064862 A1 * | 3/2015 | Hirano | H01L 27/11573 |
| | | | 438/216 |
| 2015/0111357 A1 * | 4/2015 | Tsukuda | H01L 29/66833 |
| | | | 438/287 |
| 2015/0303143 A1 * | 10/2015 | Miyazaki | H01L 27/11573 |
| | | | 257/536 |
| 2016/0043221 A1 * | 2/2016 | Hirano | H01L 27/11573 |
| | | | 257/324 |
| 2016/0093716 A1 * | 3/2016 | Tsukuda | H01L 29/66833 |
| | | | 438/588 |
| 2017/0040267 A1 * | 2/2017 | Yajima | H01L 24/02 |
| 2018/0068320 A1 * | 3/2018 | Yamada | G06Q 30/014 |
| 2018/0181696 A1 * | 6/2018 | Koh | G06F 17/5036 |
| 2018/0315722 A1 * | 11/2018 | Yajima | G11C 7/04 |

* cited by examiner

METHOD OF MAKING SEMICONDUCTOR DEVICE COMPRISING FLASH MEMORY AND RESULTING DEVICE

PRIORITY CLAIM AND CROSS-REFERENCE

This application claims the benefit of U.S. Provisional Application No. 62/592,660, filed Nov. 30, 2017, which application is expressly incorporated by reference herein in its entirety.

BACKGROUND

This disclosure relates to semiconductor devices and methods of making the same. More particularly, the disclosed subject matter relates to a method for making a device comprising embedded flash memory, and the resulting device.

As complementary metal oxide semiconductor (CMOS) devices are scaled to smaller sizes, new materials and concepts are being considered to meet advanced performance targets. CMOS technology includes N-type metal oxide semiconductor (NMOS) and P-type metal oxide semiconductor (PMOS). For example, a metal-oxide-semiconductor field-effect transistor (MOSFET) is a transistor used for amplifying or switching electronic signals. One aspect of high performance in NMOS and PMOS MOSFETS, and various other devices, is device switching frequency. Contacts are made to the gate electrodes, and to both the source and drain regions, of the transistors.

A microcomputer is a semiconductor device including a flash memory and/or a logic circuit such as central processing unit (CPU), and generally has a structure having many metal oxide semiconductor (MOS) transistors formed on a semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

FIGS. 1B-1C illustrates some steps, which may be optional and supplementary to the exemplary method of FIG. 1A.

DETAILED DESCRIPTION

Figure 1A:
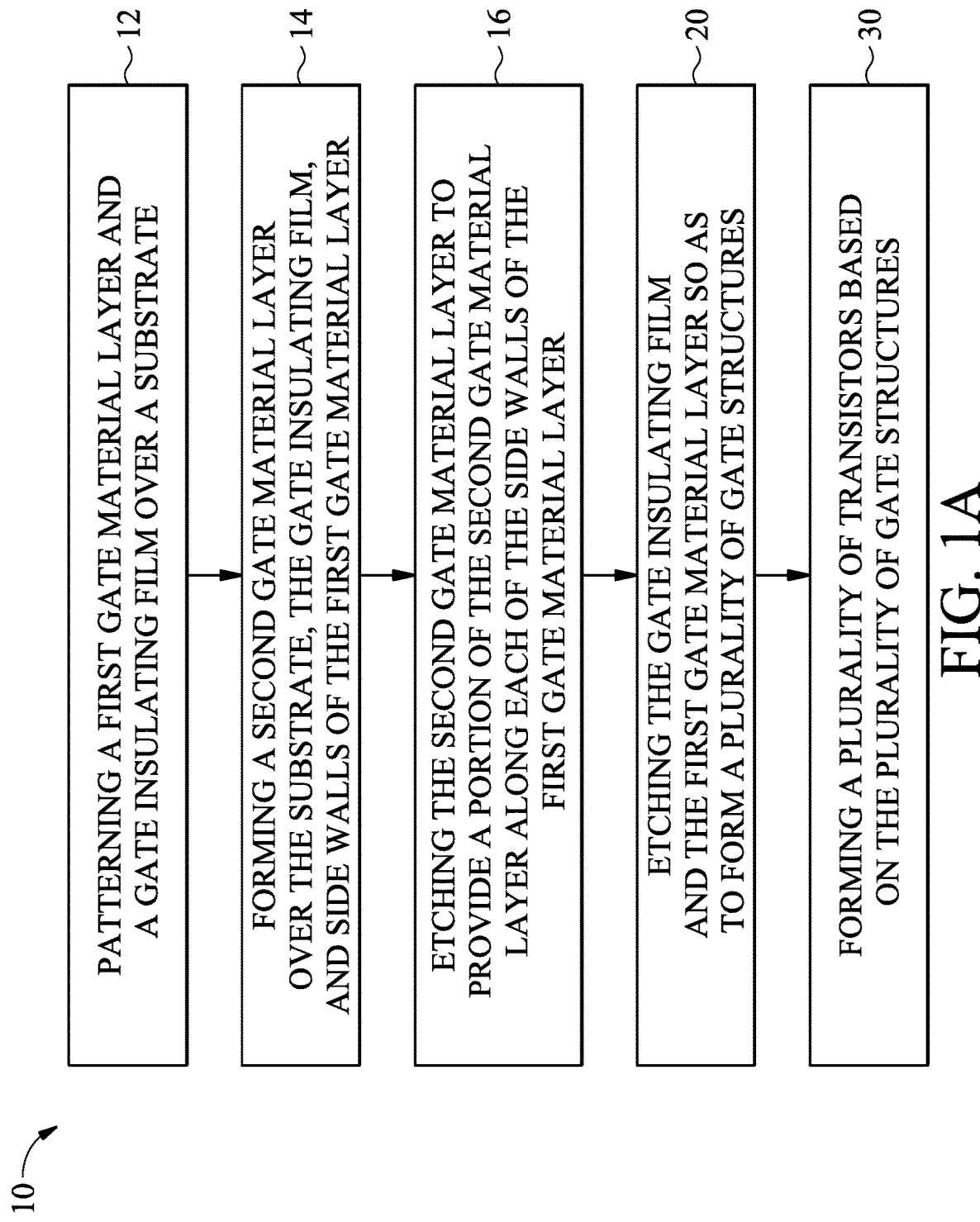
FIGS. 1A-1C are flow charts illustrating an exemplary method for forming a semiconductor device comprising an embedded flash memory in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a transistor structure" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

An example of a flash memory is a non-volatile memory, which is a device that retains recorded information even when turned off. A logic circuit such as a central processing unit (CPU) may comprise a plurality of complementary metal oxide semiconductor (CMOS) transistor, a combination of so-called n-channel and p-channel MOS transistors. Examples of a non-volatile memory include a transistor according to metal oxide nitride oxide silicon (MONOS) technology. A flash memory cell according to MONOS technology is referred to as an FMONOS (flash metal oxide nitride oxide semiconductor) memory cell. By forming FMONOS-type memory cells and CMOS transistors on a semiconductor substrate, a high-functionality microcomputer is formed.

The present disclosure provides a method of making a semiconductor device comprising embedded flash memory, and a resulting device. In FIGS. 1-9, like items are indicated by like reference numerals, and for brevity, descriptions of the structure, provided above with reference to the preceding figures, are not repeated. The methods described in FIG. 1 are described with reference to the exemplary structure described in FIGS. 2-9.

Referring to FIG. 1A, an exemplary method 10 is illustrated. A substrate 102 is provided first. The substrate 102 can be a wafer comprising a semiconductor material. Examples of suitable materials for substrate 102 include but are not limited to silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass. In some embodiments, the substrate 102 comprise silicon, which is p- or n-doped.

The substrate 102 may also include shallow trench isolation (STI) structure 104. The STI structure 104 may be formed by etching a portion of the substrate to form a trench and filling the trench with oxide and/or other dielectric materials. STI 104 is filled with an oxide material such as silicon dioxide in some embodiments.

The substrate 102 may have two regions: a first region and a second region. Based on the components to be made on or above the substrate 102, the first region may be a memory region while the second region may be a logic region.

Figure 2:
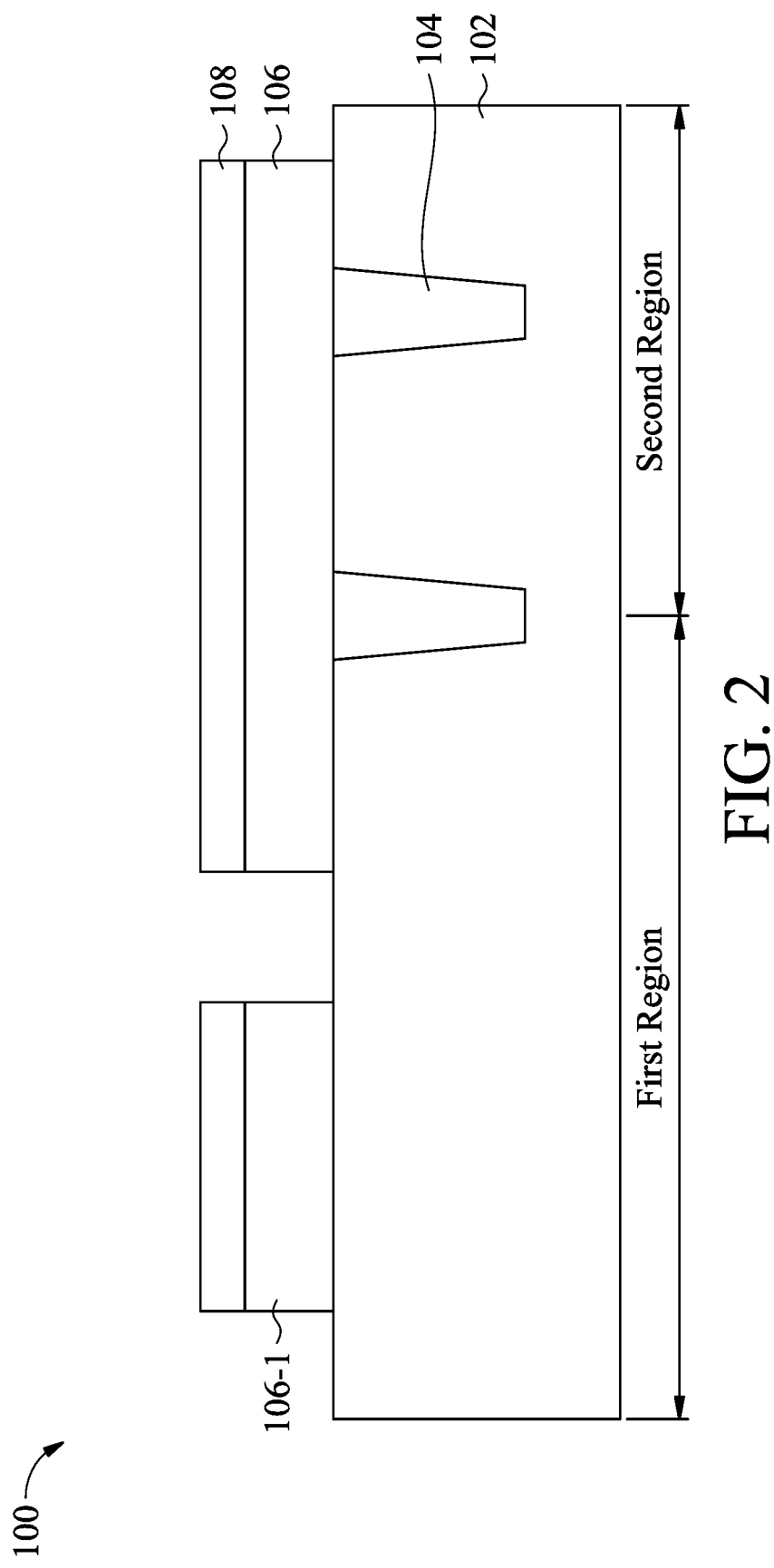
FIG. 2 is a cross-sectional view illustrating a portion of an exemplary device being fabricated in accordance with some embodiments.

Referring to FIGS. 1A and 2, at step 12, a first gate material layer 106 and a gate insulating film 108 are patterned over the substrate 102. The first gate material layer 106 comprises a first gate material. Referring to FIG. 2, in an exemplary device 100, the gate insulating film 108 is disposed on the first gate material layer 106.

The first gate material layer 106 may comprise any suitable material for a gate electrode of a transistor. In some embodiments, the first gate material layer 106 comprises polycrystalline silicon, which may be doped. The first gate material in the first gate material layer 106 may be configured to provide a control gate electrode in a first region comprising a flash metal oxide nitride oxide semiconductor (FMONOS) memory cell. The first gate material may also be configured to provide a gate electrode in a second region comprising at least one metal oxide semiconductor (MOS) transistor.

The gate insulating film 108 may be any insulating material or hard mask disposed over a gate electrode. In some embodiments, the gate insulating film 108 comprises silicon nitride, silicon dioxide, or any combination thereof. Examples of a suitable material for hard mask 108 include, but are not limited to, silicon oxide, silicon nitride (e.g., $Si_3N_4$), SiON, SiC, SiOC, or any combination thereof. The gate insulating film 108 is made of silicon nitride in some embodiments. The gate insulating film 108 may be a hard mark in some embodiments.

FIG. 2 and other figures are for illustration only, and other structural features may not be shown. For one example, the channels for transistor may be formed by doping the substrate 102. For another example, the exemplary device 100 may include a gate dielectric film between the substrate 102 and the first gate material layer 106. In some embodiments, the gate dielectric film (not shown) may be a high-k dielectric material. Examples of a high-k dielectric material include but are not limited to hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), tantalum pentaoride ($Ta_2O_5$), aluminum oxide ($Al_2O_3$), titanium dioxide ($TiO_2$), and combinations thereof. Alternatively, in some embodiments, gate dielectric film is formed on an interfacial layer, such as an oxide layer, on or above semiconductor substrate 102.

Figure 3:
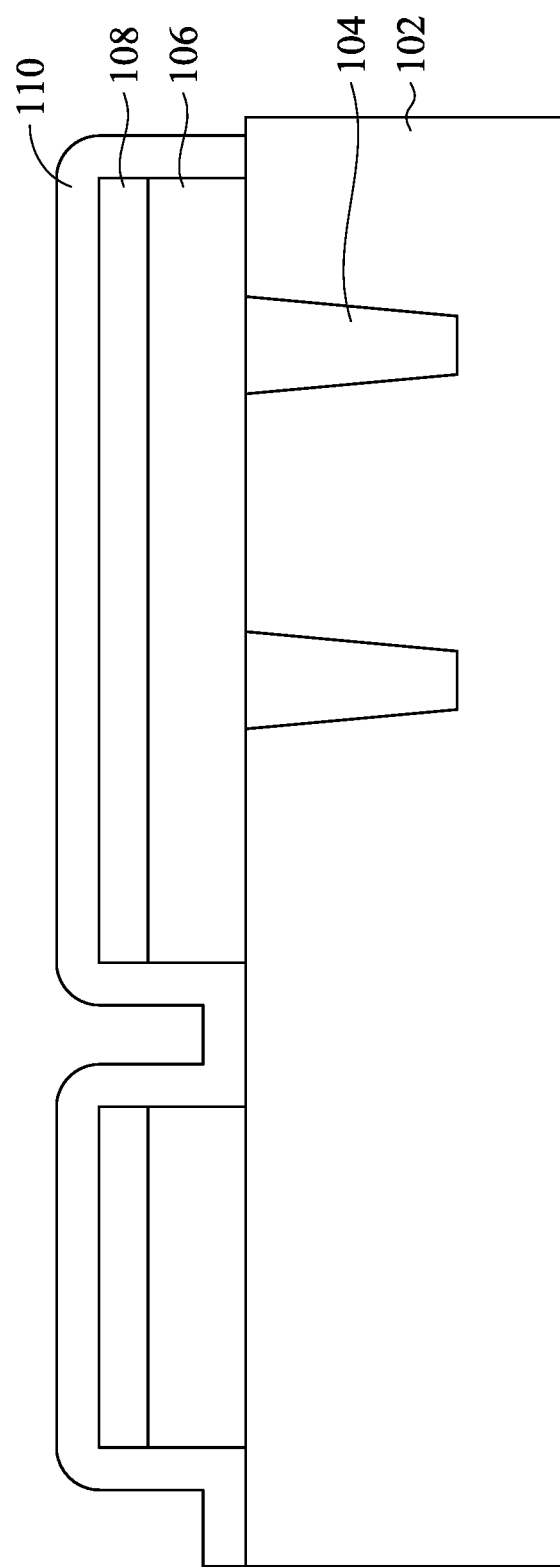
FIG. 3 illustrates a resulting device structure after forming a second gate material layer over the substrate in the exemplary device of FIG. 2.

At step 14, a second gate material layer 110 is formed over the substrate 102, the gate insulating film 108, and side walls 106-1 of the first gate material layer 106, which comprises a second gate material. The resulting structure is illustrated in FIG. 3.

The second gate material layer 110 may comprise any suitable material for a gate electrode of a transistor. In some embodiments, the second gate material layer 110 comprises polycrystalline silicon, which may be doped. The second gate material in the second gate material layer may be configured to provide a memory gate electrode in a first region comprising a flash metal oxide nitride oxide semiconductor (FMONOS) memory cell.

Before the second gate material layer 110 is formed over the substrate 102, a gate dielectric (not shown) may be formed along the side walls 106-1 of the first gate material layer 106, and on the substrate 102 adjacent to the side walls 106-1. For example, such a gate dielectric may comprise a three-layer structure comprising oxide, nitride, and oxide (ONO), which is silicon based.

Figure 4:
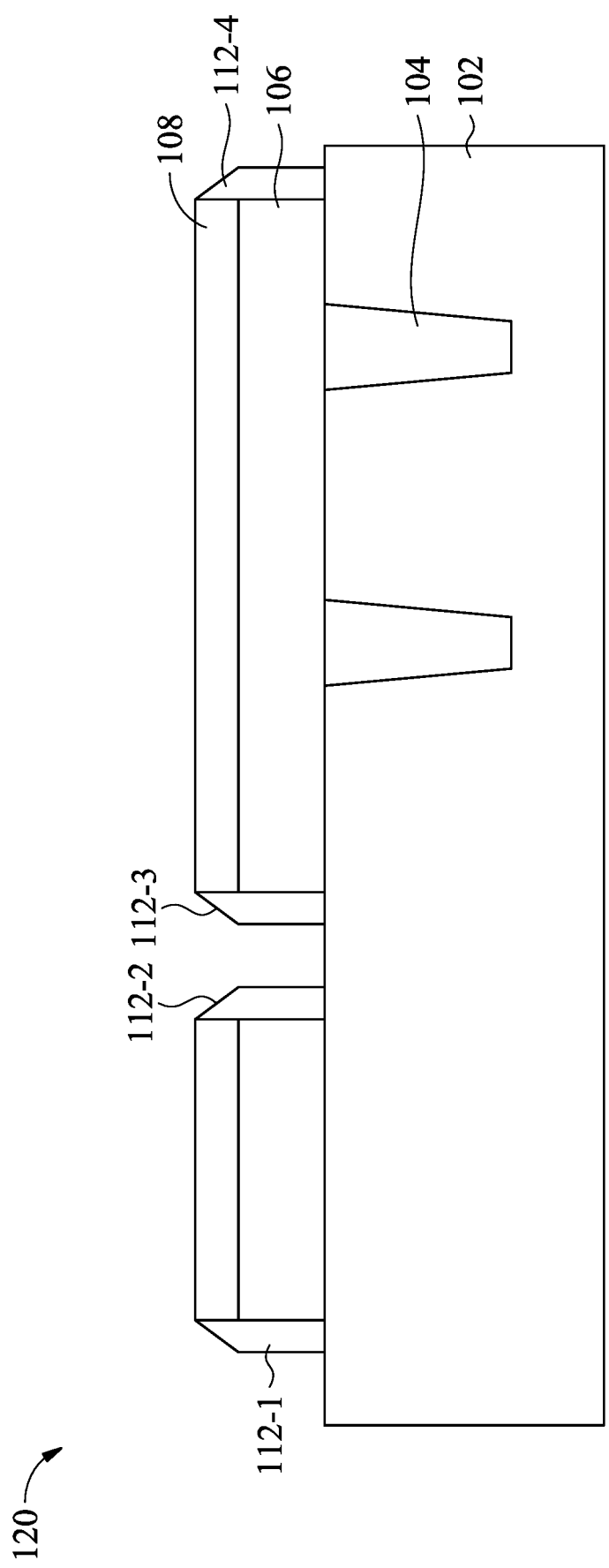
FIG. 4 illustrates a resulting device structure after etching the second gate material layer in the exemplary device of FIG. 3.

At step 16, the second gate material layer 110 is etched to expose the substrate 102 and the gate insulating film 108. The resulting structure 120 is illustrated in FIG. 4. A portion 112 (e.g., 112-1, 112-2, 112-3, 112-4) of the second gate material layer 110 remains along each of the side walls of the first gate material layer 106.

Examples of a suitable process for etching the second semiconductor layer 110 above the substrate 102 include, but are not limited to, a dry etch, for example, reaction ion etch (ME) and plasma etch. In some embodiments, the second gate material layer 110 may be etched using a suitable plasma such as a fluorine containing plasma. The etching may be non-selective and isotropic. The second gate material 110 is etched uniformly along the direction normal to the substrate 102.

Figure 5:
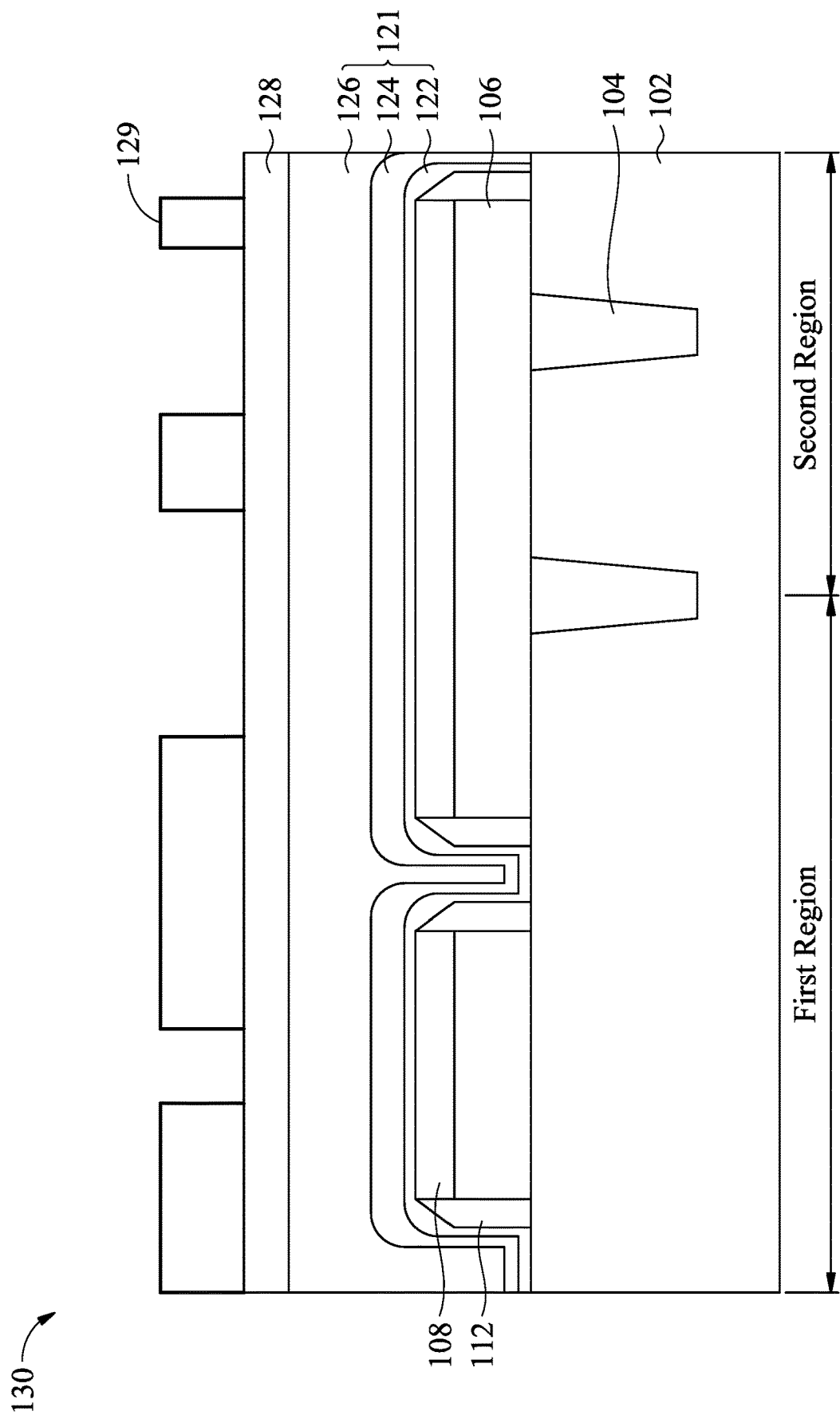
FIG. 5 illustrates a resulting device structure after forming a protective layer and a photoresist over the exemplary device of FIG. 4.
Figure 6:
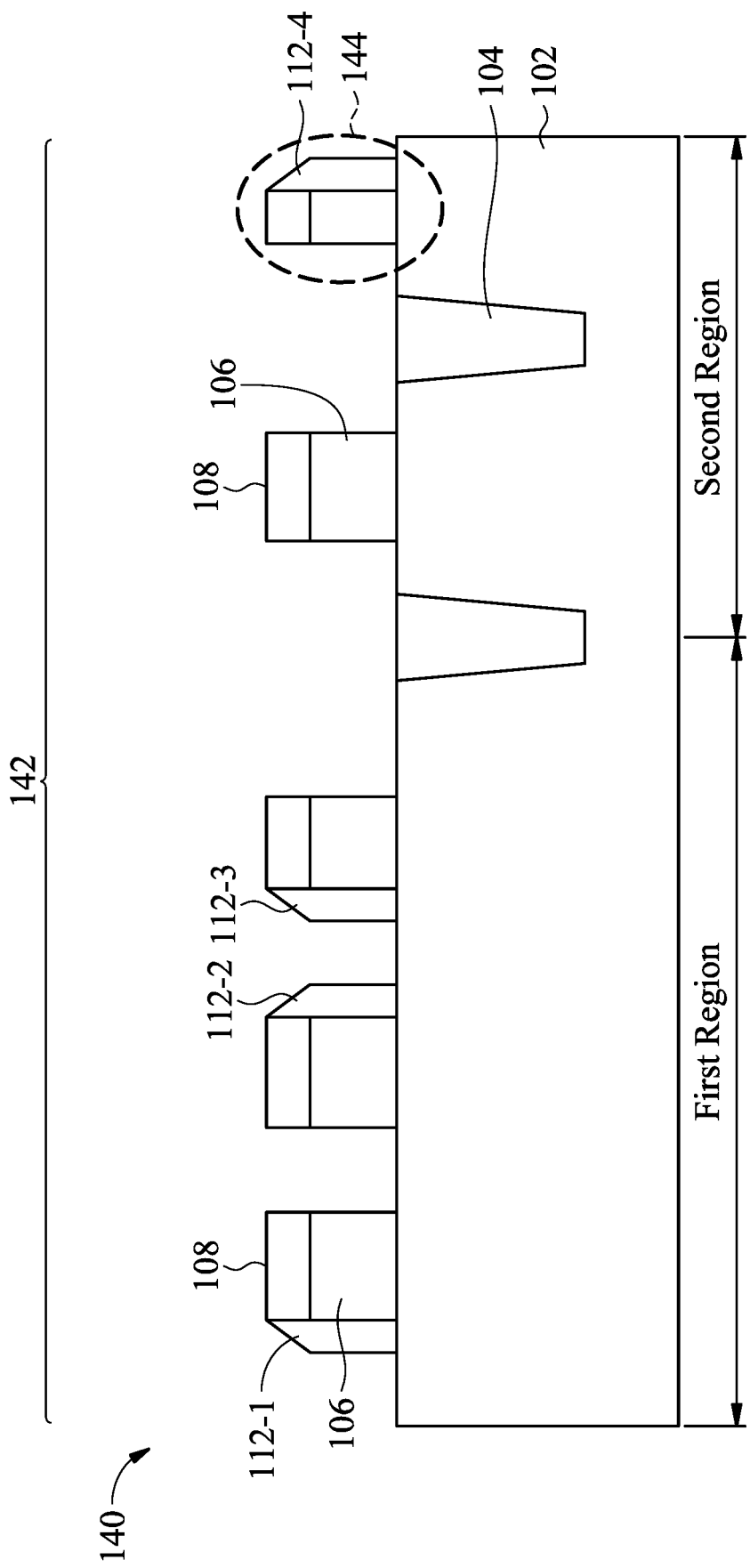
FIG. 6 illustrates a resulting device structure after etching the gate insulating film and the first gate material layer in the exemplary device of FIG. 5.

At step 20 of FIG. 1A, referring to FIGS. 4-6, the gate insulating film 108 and the first gate material layer 106 are etched so as to form a plurality of gate structures 142. The resulting device structure 140 is illustrated in FIG. 6. Referring to FIGS. 3-5, steps 22, 24, 26 and 28 of FIG. 1B may be used before and/or after step 20 in accordance with some embodiments.

Figure 1B:
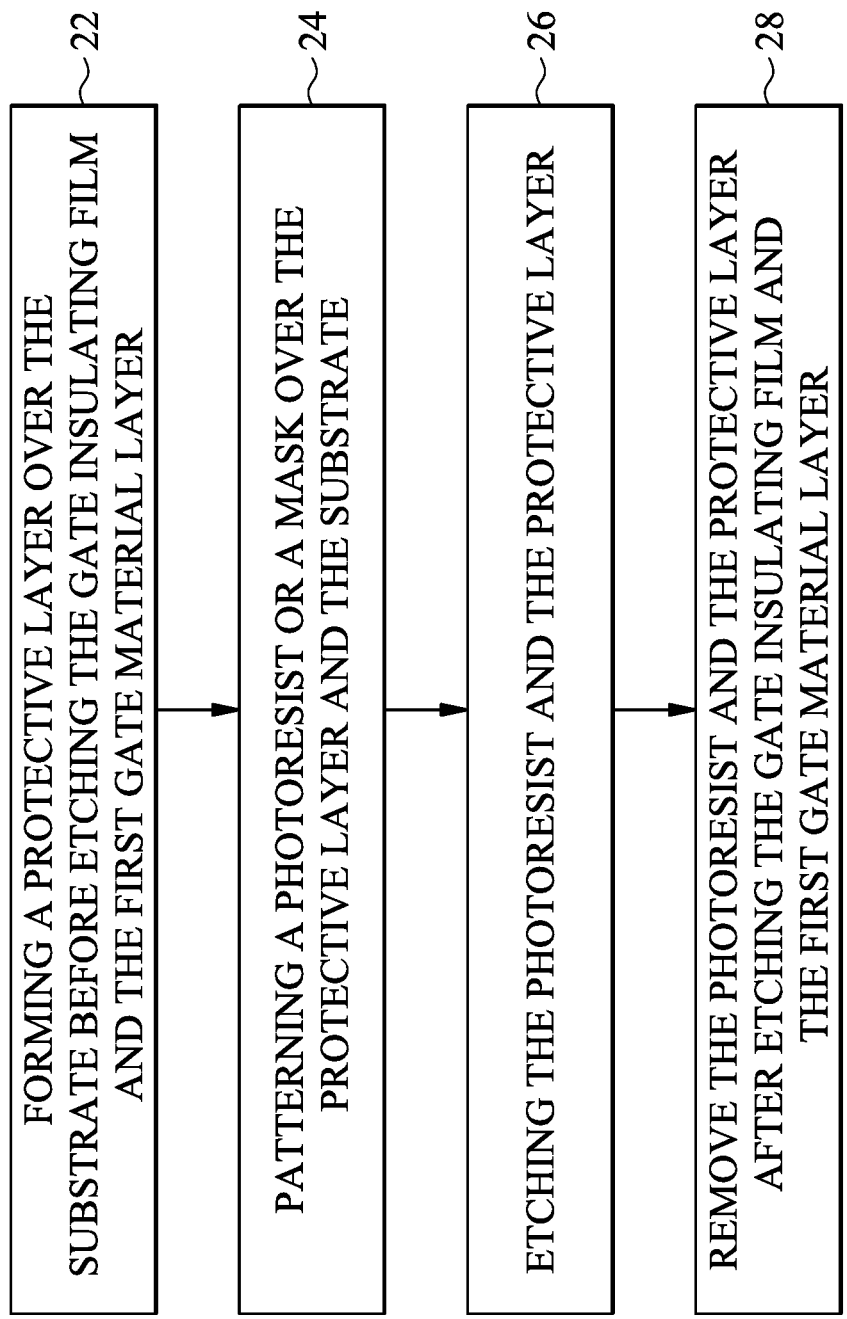

Referring to FIG. 1B and FIG. 5, at step 22, a protective layer 121 is formed over the substrate before step 20 in some embodiments. The protective layer 121 is disposed over the substrate 102, and covers the gate insulating film 108, and the portions 112 of the second gate material layer 110 along each of the side walls of the first gate material layer 106. In some embodiments, the protective layer 121 comprises a first oxide layer 122, a hard mask 124 comprising silicon nitride, and a second oxide layer 126. The first oxide layer 122 and the second oxide layer 126 comprises silicon dioxide.

At step 24, referring to FIG. 5, a photoresist 128 and/or a mask 129 is disposed over the protective layer 121.

At step 26, the photoresist 128 and the protective layer 121 are etched to form trenches before the gate insulating film 108 and the first gate material layer 106 below the trenches are etched at step 20 in some embodiments. At step 20, the gate insulating film 108 and the first gate material layer 106 are etched. Step 26 and 20 may be two different etching steps or one single etching step. Examples of a suitable process for etching the photoresist 128, the protective layer 121, the gate insulating film 108 and the first gate material layer 106 include, but are not limited to, a dry etch (e.g., RIE, plasma etch such as using fluorine-containing plasma). In some embodiments, the step of etching the gate insulating film 108 and the first gate material layer 106 (step 20) is after the second gate material 110 are formed and etched (steps 14 and 16).

At step 28, the photoresist 128 and the protective layer 121 is removed and cleaned. After steps 20 and 28, the resulting structure illustrated in FIG. 6. Photoresist 128 can be stripped by a solution comprising an ingredient such as $H_2SO_4$, $H_2O_2$, and $NH_4OH$. The protective layer 121 may be removed by using any suitable process such as chemical mechanical polishing (CMP) and a dry or wet etching process.

Referring to FIG. 6, a plurality of gate structures 142, which are divided from each other, are formed. In some embodiments, each of the plurality of gate structures 142 in the first region includes the first gate material layer 106 for a control gate electrode, and a portion 112 (e.g., 112-1, 112-2, 112-3) of the second gate material layer 110 for a memory gate electrode. As shown in FIG. 6, the plurality of gate structures 142 in the second region include the first gate material layer 106 as gate electrode. In some embodiments, the plurality of gate structures 142 in the second region may include at least one gate structure 144, which also includes a portion 112 of the second gate material layer 110. In some embodiments, the gate structure 144 including a portion 112 (e.g., 112-4) of the second gate material layer 110 is a characteristic feature resulting from the exemplary method 10 as described herein. In some embodiments, the gate structure 144 including portion 112-4 may be configured to function as a gate structure 182 without a portion 112 in the second region. In some embodiments, the gate structure 144 including portion 112-4 may be also possibly made to be similar to one of the gate structures in the first region.

At step 30 of FIG. 1A, a semiconductor device comprising a plurality of transistors can be fabricated based on the plurality of gate structures 142. In some embodiments, the plurality of transistors include a flash metal oxide nitride oxide semiconductor (FMONOS) memory cell in a first region, and at least one metal oxide semiconductor (MOS) transistor in a second region. The FMONOS memory cell comprises at least one portion 112 (e.g., 112-1, 112-2, 112-3) of the second gate material layer 110 as a memory gate electrode, as described in details in FIG. 9.

Figure 1C:
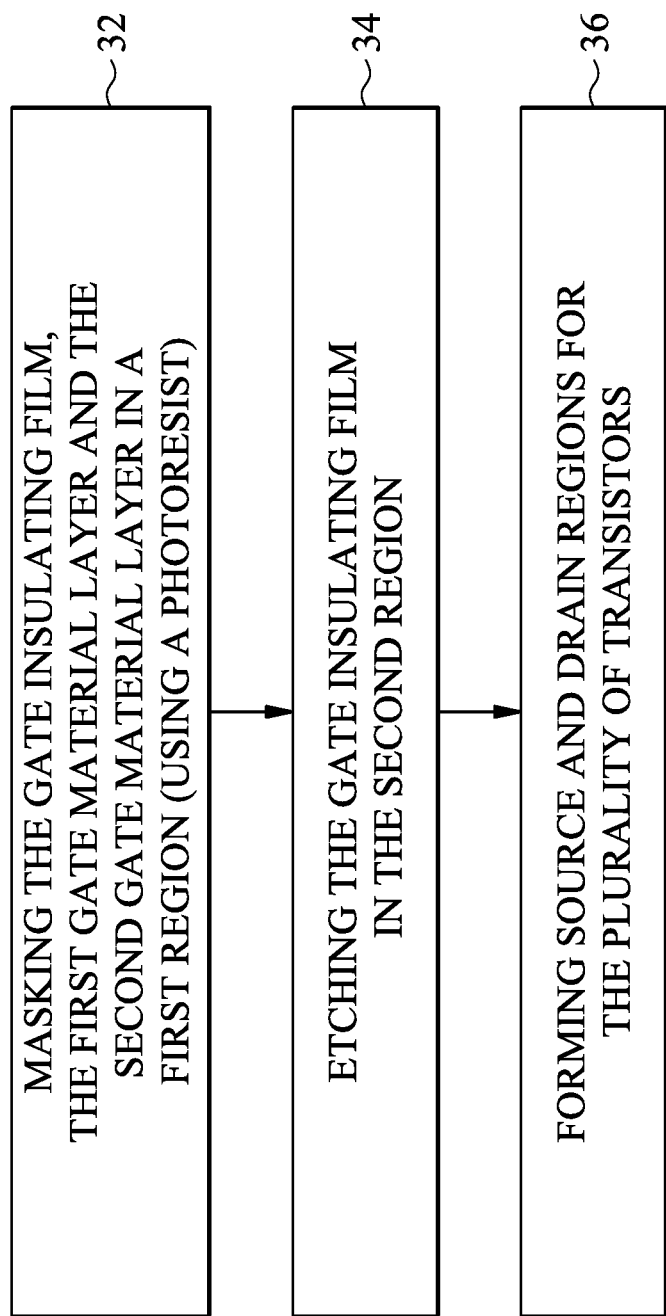
Figure 7:
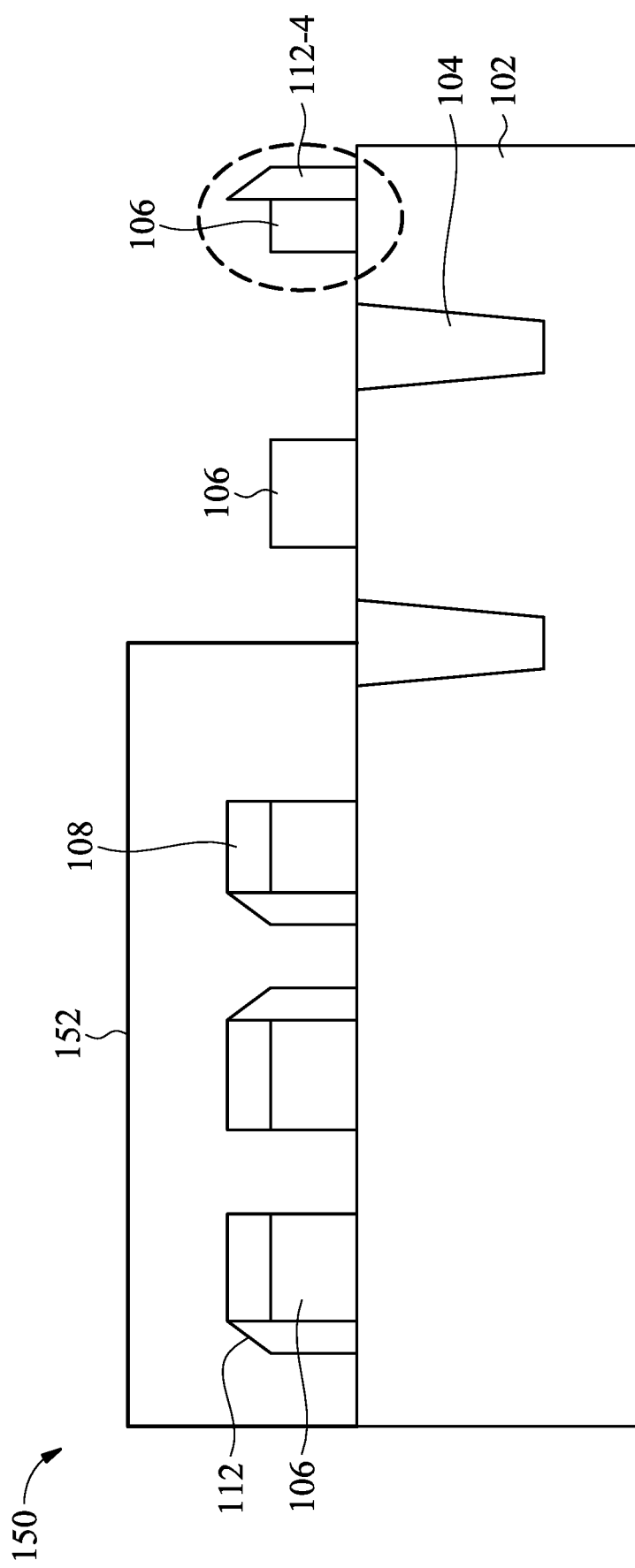
FIG. 7 illustrates a resulting device structure after marking the gate structures in a first region in the exemplary device of FIG. 6.

Referring to FIG. 1C and FIG. 7, in some embodiments, the gate insulating film 108 (or hard mask) in the second region may be removed during or before step 30. The resulting device structure is illustrated in FIG. 7.

Figure 9:
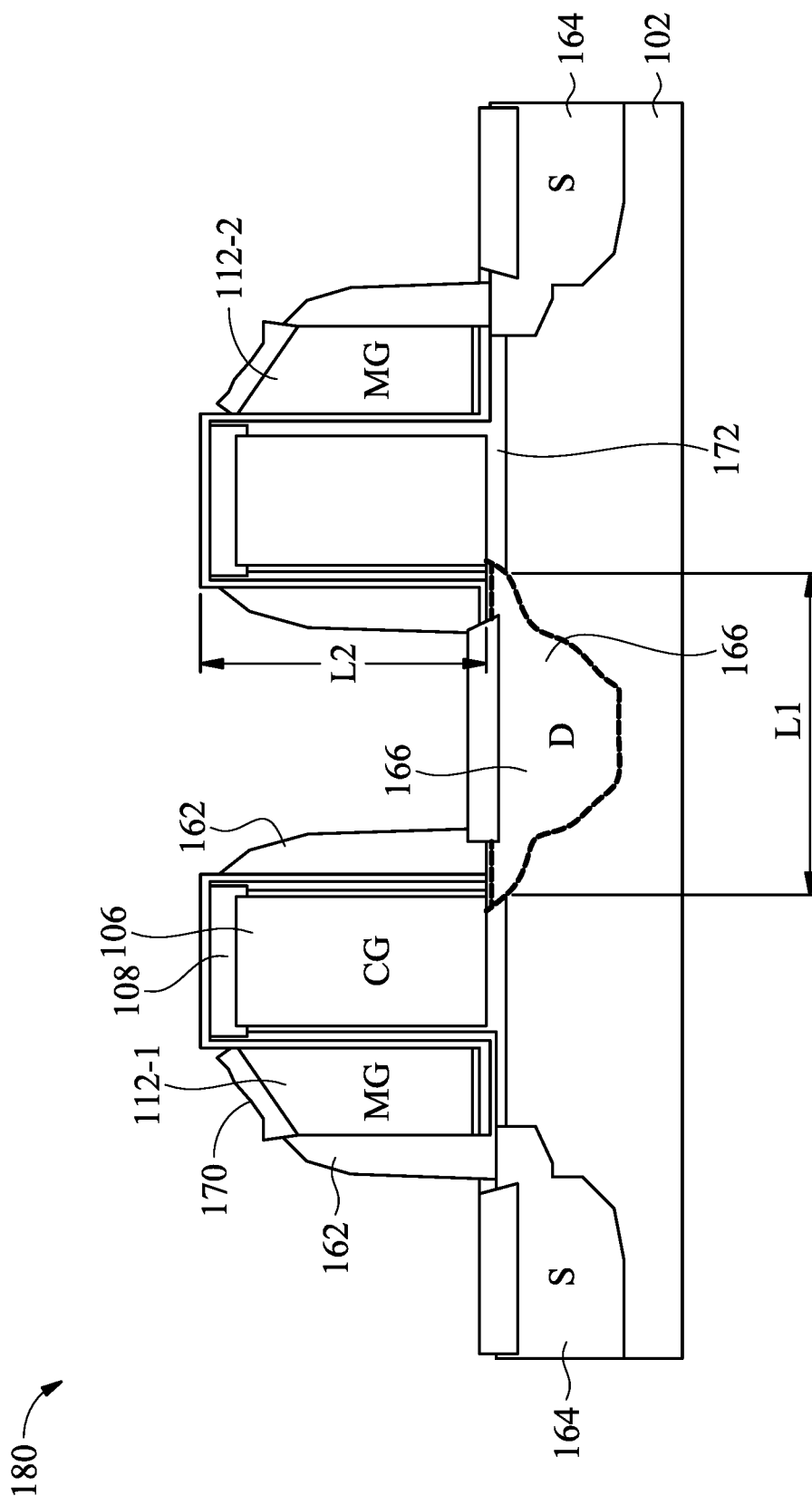
FIG. 9 is an enlarged detail of FIG. 8, showing components in the first region in the exemplary device of FIG. 8 in accordance with some embodiments.
Figure 10:
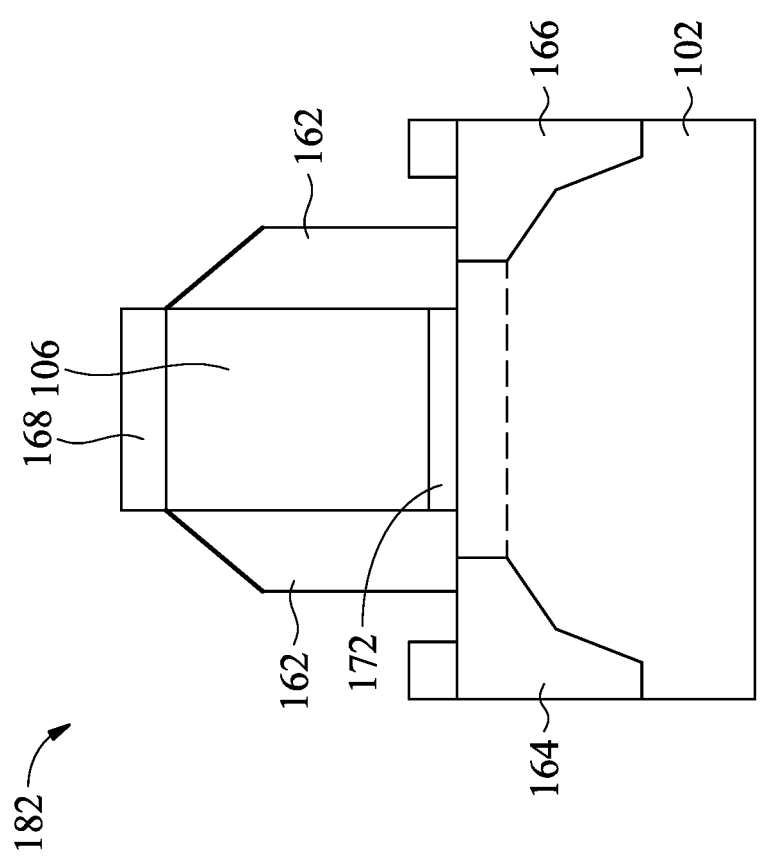
FIG. 10 is an enlarged detail of FIG. 8, showing components in the second region of the exemplary device of FIG. 8 in accordance with some embodiments.

At step 32 of FIG. 1C, the first region comprising the gate insulating film 108, the first gate material layer 106, and the second gate material layer 112, is masked using a photoresist 152. At step 34, the gate insulating film 108 in the second region is etched. At step 36, source and drain regions 164, 166 and other structural components are formed. A resulting device 160 is illustrated in FIGS. 8-10.

Figure 8:
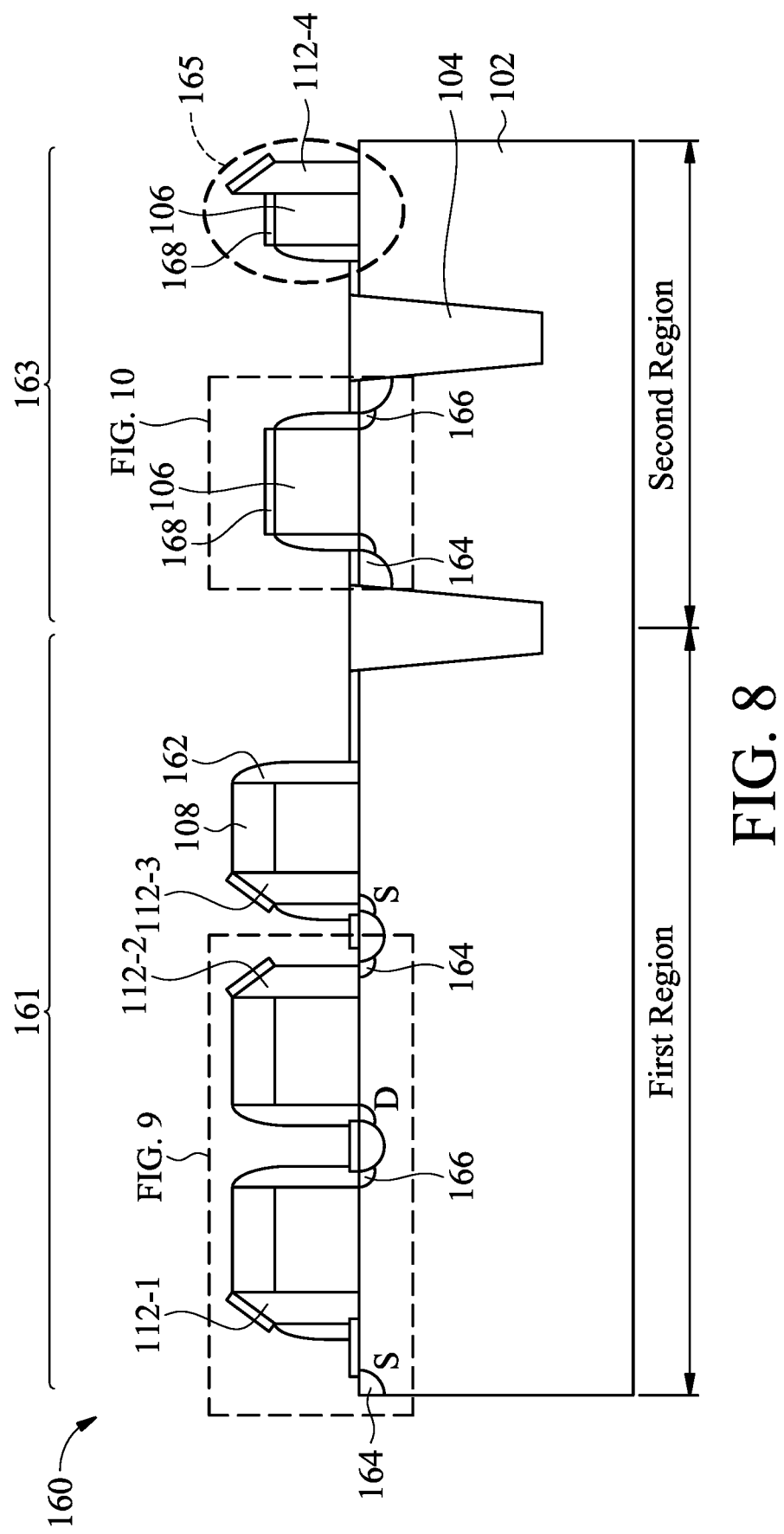
FIG. 8 is a cross-sectional view illustrating an exemplary device including a first region comprising a FMONOS memory cell, and a second region comprising at least one MOS transistor in accordance with some embodiments.

Referring to FIG. 8, the device 160 comprises a substrate 102 having a first region and a second region, and a plurality of transistors in and above the substrate 102. In some embodiments, the first region may be a memory region while the second region may be a logic region. A respective portion of the first region and the second region is illustrated in FIGS. 9 and 10, respectively. FIG. 9 illustrates a portion 180 in the first region, and FIG. 10 illustrates a portion including a MOS transistor 182 in the second region.

In some embodiments, the device 100 further comprises at least one shallow trench isolation (STI) structure 104 within the substrate 102. The at least one STI structure 104 is between the first region and the second region. The first gate material 106 and the second gate material 112 (e.g., 112-1, 112-2, 112-3, 112-4) resulting from gate material 110 comprise polycrystalline silicon but with different doping or doping concentration.

In some embodiments, the device 160 comprises a flash metal oxide nitride oxide semiconductor (FMONOS) memory cell 161 within and above the substrate 102 in the first region. As illustrated in FIGS. 8-9, the FNOMOS memory cell 161 comprises a first gate material 106 as a control gate electrode and a portion 112 (e.g, 112-1, 112-2, 112-3) of a second gate material 110 as a memory gate electrode. The memory gate electrode is used as a memory gate for storing data in the FMONOS. The control gate serves as a transistor for selecting the FMONOS memory cell 161, while the memory gate serves as a memory for storing information in the FMONOS memory cell 161.

As illustrated in FIGS. 8 and 10, the device 100 may also comprise at least one metal oxide semiconductor (MOS) transistor 163 within and above the substrate 102 in a second region. The at least one MOS transistor 163 comprises a first MOS transistor 165 having the first gate material 106 and a portion 112-4 of the second gate material 110 as a gate electrode. In some embodiments, the semiconductor device further comprises a second MOS transistor 182 (FIG. 10) having the first gate material 106 only, without the second gate material 110. The first gate material 106 is the only gate electrode. The second MOS transistor 182, which is in the second region, is disposed between the FNOMOS memory cell 161 in the first region and the first MOS transistor 165 in the second region.

In some embodiments, the FMONOS memory cell 161 is an n-channel memory cell. In some embodiments, the MOS transistor 163 may include an NMOS (n-channel transistor) and/or a PMOS (p-channel transistor). The FMONOS and NMOS may be formed in a p-type well region in or over the substrate 102. The NPMOS may be formed in an n-type well in or over the substrate 102.

As illustrated in FIGS. 8-10, each transistor may include other structural elements including, but not limited to, spacers 162 along gate electrode 106 or 112, a channel region (not shown) below a respective gate electrode 106 and 112, source and drain regions 164 and 166, spacers 162, a silicide layer 170, and a gate dielectric film 172. In some embodiments, source and drain regions 164 and 166 are made after the step of etching the gate insulating film 108 and the first gate material layer 106 (step 20). In some embodiments, source and drain regions 164 and 166 may be formed in any preceding step, for example, before step 12. In the FNOMOS memory cell 161 in the first region, a transistor may include another gate dielectric disposed between a control gate electrode (106 in FIG. 9) and a memory gate electrode (112 in FIG. 9), and between a memory gate electrode and the substrate 102. Such a gate dielectric comprise a three-layer ONO structure, which include a first silicon oxide layer (contacting the substrate 102 and the control gate), a silicon nitride layer and then a second silicon oxide layer. The gate insulating film 108, which is made of silicon nitride in some embodiments, may remain in the FNOMOS memory cell as a cap. Instead of a silicon nitride cap, the MOS transistor 163 may include a silicide or an oxide layer 168 above the first gate material layer 106. The device 160 may also comprise a dielectric (e.g., oxide) layer, and an inter layer dielectric (ILD) layer, and contact structures (not shown) such as formed from tungsten, aluminum or copper.

Referring back to FIG. 1A, step 20 is after steps 14 and 16. The inventors have determined that the exemplary method 10 of FIG. 1A provides advantages in processing, device quality and performance. In a comparative method, the first gate material layer 106 and the gate insulating film 108 are etched into divided gate electrodes first, and the second gate material layer 110 is then coated over the substrate 102. But because the gaps between each gate electrode have limited size with aspect ratio (ratio of width to depth), the second gate material layer 110 is hard to be formed inside the gaps, therefore, such a comparative method results in more defects in the memory cell. Some transistor may have no or defected memory gate. The method provided in the present disclosure, which include less steps, provides a resulting device as described above with good quality. Such a method also results in a device having at least one transistor 165 having both the first gate material 106 and a portion 112-4 of the second gate material 110 (FIG. 8).

The present disclosure provides a method for making a semiconductor device, and the resulting semiconductor device.

In one aspect, a method is provided. Such a method comprises patterning a first gate material layer and a gate insulating film over a substrate. The first gate material layer comprises a first gate material. The gate insulating film is disposed on the first gate material layer. The method further comprises forming a second gate material layer over the substrate, the gate insulating film, and side walls of the first gate material layer. The second gate material layer comprises a second gate material. The method further comprises etching the second gate material layer to expose the substrate and the gate insulating film and provide a portion of the second gate material layer along each of the side walls of the first gate material layer, and etching the gate insulating film and the first gate material layer, after the second gate material layer is formed and etched, so as to form a plurality of gate structures. In some embodiments, the second gate material layer may be etched using a suitable plasma such as a fluorine containing plasma. The second gate material is etched uniformly along the direction normal to the substrate.

In some embodiments, the first gate material layer comprises polycrystalline silicon. The first gate material layer may be configured to provide a control gate electrode in a first region comprising a flash metal oxide nitride oxide semiconductor (FMONOS) memory cell. The first gate material layer may also be configured to provide a gate electrode in a second region comprising at least one metal oxide semiconductor (MOS) transistor.

In some embodiments, the second gate material layer comprises polycrystalline silicon. The second gate material layer may be configured to provide a memory gate electrode in a first region comprising a flash metal oxide nitride oxide semiconductor (FMONOS) memory cell.

The gate insulating film comprises silicon nitride, silicon dioxide, or any combination thereof. The gate insulating film may be a hard mars in some embodiments.

In some embodiments, the method further comprises forming a protective layer over the substrate before etching the gate insulating film and the first gate material layer. The protective layer is over the substrate, and covers the gate insulating film, and the portion of the second gate material layer along each of the side walls of the first gate material layer. The gate insulating film and the first gate material layer are etched in a pattern defined by a photoresist or a mask disposed over the protective layer. In some embodiments, the protective layer comprises a first oxide layer, a hard mask comprising silicon nitride, and a second oxide layer. The protective layer is etched to form trenches before the gate insulating film and the first gate material layer below the trenches.

In accordance with some embodiments, the present disclosure provides a method for making a semiconductor device. Such a method comprises patterning a first gate material layer and a gate insulating film over a substrate, and forming a second gate material layer over the substrate, the gate insulating film, and side walls of the first gate material layer. The first gate material layer comprises a first gate material. The gate insulating film is disposed on the first gate material layer. The second gate material layer comprises a second gate material. The method further comprises etching the second gate material layer to expose the substrate and the gate insulating film and provide a portion of the second gate material layer along each of the side walls of the first gate material layer. The method may further comprise etching the gate insulating film and the first gate material layer, after the second gate material layer is formed and etched, so as to form a plurality of divided gate structures in a first region and a second region, and forming a plurality of transistors based on the plurality of divided gate structures. The first region may be a memory device region and the second region may be a logic device region in some embodiments. In some embodiments, in the first region, the first gate material layer is configured to provide control gate electrodes and the second gate material layer is configured to provide memory gate electrodes.

In some embodiments, the plurality of transistors include a flash metal oxide nitride oxide semiconductor (FMONOS) memory cell in a first region, and at least one metal oxide semiconductor (MOS) transistor in a second region. The FMONOS memory cell comprises at least one portion of the first gate material as a control gate electrode and at least one portion of the second gate material layer as a memory gate electrode in one transistor.

In some embodiments, the method further comprises masking the gate insulating film, the first gate material layer and the second gate material layer in a first region, and etching the gate insulating film in the second region.

In some embodiments, forming a plurality of transistors based on the plurality of gate structures includes forming source and drain regions for the plurality of transistors.

In another aspect, the present disclosure provides a resulting semiconductor device. Such a device comprises a substrate having a first region and a second region, and a plurality of transistors in and above the substrate. The first region may be a memory region while the second region may be a logic region. In some embodiments, the device comprises a flash metal oxide nitride oxide semiconductor (FMONOS) memory cell within and above the substrate in the first region. The FNOMOS memory cell comprises a first gate material as a control gate electrode and a portion of a second gate material as a memory gate electrode. The device may also comprise at least one metal oxide semiconductor (MOS) transistor within and above the substrate in a second region. The at least one MOS transistor comprises a first MOS transistor having the first gate material and the second gate material as a gate electrode.

In some embodiments, the device further comprises at least one shallow trench isolation (STI) structure within the substrate. The at least one STI structure is between the first region and the second region. The first gate material and the second gate material comprises polycrystalline silicon but with different doping or doping concentration.

In some embodiments, the semiconductor device further comprises a second MOS transistor having the first gate material only without the second gate material. The first gate material is the only gate electrode. The second MOS transistor, which is in the second region, is disposed between the FNOMOS memory cell in the first region and the first MOS transistor in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:
   patterning a first gate material layer and a gate insulating film over a substrate, the first gate material layer comprising a first gate material, the gate insulating film disposed on the first gate material layer;
   forming a second gate material layer over the substrate, the gate insulating film, and side walls of the first gate material layer, the second gate material layer comprising a second gate material;
   etching the second gate material layer to expose the substrate and the gate insulating film and provide a portion of the second gate material layer along each of the side walls of the first gate material layer; and
   etching the gate insulating film and the first gate material layer, after the second gate material layer is formed and etched, so as to form a plurality of gate structures, wherein the first gate material layer is configured to provide a control gate electrode in a first region comprising a flash metal oxide nitride oxide semiconductor (FMONOS) memory cell.

2. The method of claim 1, wherein the first gate material layer comprises polycrystalline silicon.

3. The method of claim 1, wherein the first gate material layer is configured to provide a gate electrode in a second region comprising at least one metal oxide semiconductor (MOS) transistor.

4. The method of claim 1, wherein the second gate material layer comprises polycrystalline silicon.

5. The method of claim 1, wherein the second gate material layer is configured to provide a memory gate electrode in a first region comprising a flash metal oxide nitride oxide semiconductor (FMONOS) memory cell.

6. The method of claim 1, wherein the gate insulating film comprises silicon nitride, silicon dioxide, or any combination thereof.

7. The method of claim 1, wherein the second gate material layer is etched using a fluorine-containing plasma.

8. The method of claim 1, further comprising:
   forming a protective layer over the substrate before etching the gate insulating film and the first gate material layer, the protective layer covering the first gate material layer, the gate insulating film, and the portion of the second gate material layer along each of the side walls of the first gate material layer.

9. The method of claim 8, wherein the gate insulating film and the first gate material layer are etched in a pattern defined by a photoresist or a mask disposed over the protective layer.

10. The method of claim 8, wherein the protective layer comprises a first oxide layer, a hard mask comprising silicon nitride, and a second oxide layer.

11. A method for making a semiconductor device, comprising:
    patterning a first gate material layer and a gate insulating film over a substrate, the first gate material layer comprising a first gate material, the gate insulating film disposed on the first gate material layer;
    forming a second gate material layer over the substrate, the gate insulating film, and side walls of the first gate material layer, the second gate material layer comprising a second gate material;
    etching the second gate material layer to expose the substrate and the gate insulating film and provide a portion of the second gate material layer along each of the side walls of the first gate material layer;
    etching the gate insulating film and the first gate material layer, after the second gate material layer is formed and etched, so as to form a plurality of divided gate structures in a first region and a second region; and
    forming a plurality of transistors based on the plurality of divided gate structures in the first region and the second region, wherein in the first region the first gate material layer is configured to provide control gate electrodes and the second gate material layer is configured to provide memory gate electrodes,
    wherein the plurality of transistors include a flash metal oxide nitride oxide semiconductor (FMONOS) memory cell in the first region, and at least one metal oxide semiconductor (MOS) transistor in the second region.

12. The method of claim 11, wherein the FMONOS memory cell comprises at least one portion of the first gate material as a control gate electrode and at least one portion of the second gate material layer as a memory gate electrode in one transistor.

13. The method of claim 11, further comprising:
masking the gate insulating film, the first gate material layer and the second gate material layer in a first region; and
etching the gate insulating film in the second region.

14. The method of claim 11, wherein forming a plurality of transistors based on the plurality of gate structures includes forming source and drain regions for the plurality of transistors.

15. A method for making a semiconductor device, comprising:
patterning a first gate material layer and a gate insulating film over a substrate, the first gate material layer comprising a first gate material, the gate insulating film disposed on the first gate material layer;
forming a second gate material layer over the substrate, the gate insulating film, and side walls of the first gate material layer, the second gate material layer comprising a second gate material;
etching the second gate material layer to expose the substrate and the gate insulating film and provide a portion of the second gate material layer along each of the side walls of the first gate material layer; and
etching the gate insulating film and the first gate material layer, after the second gate material layer is formed and etched, so as to form a plurality of gate structures,
wherein the second gate material layer is configured to provide a memory gate electrode in a first region comprising a flash metal oxide nitride oxide semiconductor (FMONOS) memory cell.

16. The method of claim 15, wherein the first gate material layer comprises polycrystalline silicon.

17. The method of claim 15, wherein the first gate material layer is configured to provide a gate electrode in a second region comprising at least one metal oxide semiconductor (MOS) transistor.

18. The method of claim 15, wherein the second gate material layer comprises polycrystalline silicon.

19. The method of claim 15, wherein the gate insulating film comprises silicon nitride, silicon dioxide, or any combination thereof.

20. The method of claim 15, wherein the second gate material layer is etched using a fluorine-containing plasma.

* * * * *